(12) United States Patent
Schneider et al.

(10) Patent No.: US 6,903,805 B2
(45) Date of Patent: Jun. 7, 2005

(54) LITHOGRAPHIC APPARATUS AND DEVICE MANUFACTURING METHOD

(75) Inventors: Ronald Maarten Schneider, Eindhoven (NL); Jakob Vijfvinkel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/288,566

(22) Filed: Nov. 6, 2002

(65) Prior Publication Data

US 2003/0098960 A1 May 29, 2003

(30) Foreign Application Priority Data

Nov. 9, 2001 (EP) .............................................. 01309498

(51) Int. Cl.[7] ........................ G03B 27/58; G03B 27/52; G03B 27/42
(52) U.S. Cl. ............................. 355/72; 355/30; 355/53
(58) Field of Search ....................... 355/30, 53, 72–76; 310/10, 12; 378/34, 35

(56) References Cited

U.S. PATENT DOCUMENTS 4,191,385 A  3/1980  Fox et al. ......................... 277/3
6,317,479 B1 * 11/2001 Chiba et al. ................... 378/35
6,445,440 B1   9/2002  Bisschops et al. ............. 355/53
6,639,650 B2 * 10/2003 Shirasaki ....................... 355/30

FOREIGN PATENT DOCUMENTS

| EP | 1052551 A2 | 11/2000 | |
| EP | 1098225 A2 | 5/2001 | |
| JP | 2001267200 A * | 9/2001 | ......... H01L/21/027 |
| WO | WO 01/84241 | 11/2001 | |

* cited by examiner

Primary Examiner—Henry Hung Nguyen
(74) Attorney, Agent, or Firm—Pillsbury Winthrop LLP

(57) ABSTRACT

In a lithographic projection apparatus, a slider is provided for motion of the substrate table or mask table. The slider is supported on a gas-bearing and separates a region at atmospheric pressure from a vacuum space region. A differential pressure pump is provided to maintain the pressure difference in the presence of the gas-bearing. A pressure compensation vessel is provided on top of the slider and also contains a vacuum. Over most of the area of the slider, the pressure on its opposed first and second sides is the same and so deformation of the slider is avoided. The sidewalls of the pressure compensation vessel transmit the external gas pressure to the slider such that they are in line with the forces of the gas-bearing.

19 Claims, 4 Drawing Sheets

LITHOGRAPHIC APPARATUS AND DEVICE MANUFACTURING METHOD

RELATED APPLICATION

This application claims the benefit of priority to European Patent Application No. 01309498.2, filed Nov. 9, 2001, the contents of which are herein incorporated by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and U.S. Pat. No. 6,262,796.

In such a lithographic apparatus, it is typically necessary to provide regions within the apparatus that are at different gas pressures, for example certain regions will be at atmospheric pressure and other regions will be under vacuum. However, there is a need to provide components within the apparatus that can move freely, but which separate regions at different pressures. Thus it is necessary to provide an arrangement that has a bearing to allow movement of the component and also a vacuum seal to maintain the pressure difference between the regions separated by the movable components.

FIG. 2(a) of the accompanying drawings illustrates schematically such a vacuum-sealed gas-bearing assembly. It consists of a slider 10 separating a region of gas at atmospheric pressure from an evacuated chamber 12 containing a vacuum. At the interface between the slider 10 and the chamber 12, a gas-bearing 14 is provided. This may consist of one or more holes or grooves out of which gas is pumped to provide a cushion of gas to support the slider 10 and allow it to move with very little friction. The holes or grooves from which the gas is pumped may be separated by lands on which the gas resides under pressure. Motion of the slider 10 can be induced by a mechanism (not shown), such as an electromagnetic actuator or motor.

A differential pressure seal 16 is also provided at the interface between the slider 10 and the chamber 12. The differential pressure seal 16 comprises one or more successive grooves or holes through which gas is sucked by a vacuum pump. Thus any gas expelled by the gas-bearing 14 and which moves in the direction towards the vacuum interior of the chamber 12 is swept away by the differential pressure seal 16.

Further details regarding a vacuum-sealed gas-bearing assembly are described, for example, in U.S. Pat. No. 4,191,385 incorporated herein by reference.

One problem with such an assembly is that, as shown in FIG. 2(b), the atmospheric pressure outside the vacuum space exerts a force distributed over all of the upper surface of the slider 10, but on the opposite side of the slider 10 there is no corresponding force exerted by the vacuum, instead there is just the force at the gas-bearing indicated by the large upward arrows in FIG. 2(b). The consequence of this distribution of forces is that there is a tendency for the slider 10 to deform because of the large bending moment exerted on it. However, deformation cannot be tolerated because of the very high precision requirements for the sliding surfaces at the gas-bearing. In the figures, the gap between the sliding surfaces is not shown to scale. In practice it is extremely small, and so the surfaces must be flat and parallel to a high tolerance. Consequently, the conventional design is a very rigid, and consequently very heavy, slider 10 to avoid any deformation of the sliding surfaces. This then results in the problem that it requires a lot of force to displace the heavy slider 10.

When such gas-bearing assemblies are to be used in a lithographic apparatus, for example, to support a slider which comprises a substrate table or a mask table, these tables have to be moved very rapidly and have to be accelerated very often which results in the problems that a heavy design requires a lot of force, heavy balance masses and a lot of power dissipation in the apparatus.

SUMMARY OF THE INVENTION

It is an aspect of the present invention to alleviate, at least partially, the above problems.

This and other aspects are achieved according to the invention in a lithographic apparatus including a radiation system constructed and arranged to supply a projection beam of radiation; a support structure constructed and arranged to support a patterning device, the patterning device constructed and arranged to pattern the projection beam according to a desired pattern; a vacuum chamber constructed and arranged to provide a vacuum beam path for the projection beam; a substrate table to hold a substrate; a projection system constructed and arranged to project the patterned beam onto a target portion of the substrate; a movable member supported in use by a gas-bearing, the movable member having opposed first and second sides, the second side being exposed to the interior of the vacuum chamber; and a pressure compensation vessel provided on the first side of the movable member constructed and arranged to provide substantially equal gas pressure over at least a portion of the first and second sides of the movable member.

Providing substantially equal gas pressure over at least a portion of the first and second sides of the movable member can substantially reduce the bending moment on the movable member so that it can be made less rigid and less heavy while still maintaining the necessary tolerance at the sliding surfaces of the gas-bearing to enable satisfactory operation. The equality of the gas pressure can be judged relative to atmospheric pressure, for example the pressure on one side might be a rough vacuum and the pressure on the other side might be an ultra-high vacuum, but both would be essentially zero pressure with respect to atmospheric pressure.

Preferably the interior of the pressure compensation vessel is in communication with the region on the second side of the movable member by a passageway. This enables the pressure equalization to be easily achieved, passively, without any additional equipment, pumps, pressure monitoring and so forth.

Preferably the pressure compensation vessel is at least partially deformable. This enables it to be made lightweight.

Preferably at least one wall of the pressure compensation vessel contacts the movable member in the vicinity of the area at which the movable member is supported, in use, by the gas-bearing. This means that the force on the movable member exerted by the external pressure on the pressure compensation vessel is substantially in line with the force on the movable member exerted by the gas-bearing, and therefore the torque or bending moment on the movable member is substantially minimised.

Preferably a hollow member is provided on the second side of the movable member, and an aperture is provided from the interior of the hollow member through the movable member and through the pressure compensation vessel. This means that, for example, air can be obtained inside the movable member, such as a slider, and cables can be conducted out of the slider. Preferably bellows are provided around the aperture to isolate the interior of the pressure compensation vessel from the interior of the hollow member. The bellows provide a barrier to enable the interior of the pressure compensation vessel to be maintained at a different pressure from the interior of the hollow member, but, being bellows, the pressure compensation vessel can still deform, and crucially, when deformed the bellows do not exert force on the movable member. Thus deformations of the pressure compensation vessel are decoupled from the movable member by the bellows, and therefore deformation of the sliding surfaces is still avoided.

The movable member can be a slider to allow displacements for xy coordinate positioning of a substrate table or mask table or the movable member can be a rotor to enable rotational positioning about a particular axis, or can combine both linear sliding and rotation.

Preferably the gas pressure within the pressure compensation vessel and on the second side of the movable member, within the vacuum chamber, is less than atmospheric pressure, more preferably the pressure is less than 100 Pa or indeed several or many orders of magnitude lower than this, e.g. less than $10^{-2}$ Pa ($10^{-4}$ mbar), and preferably is a vacuum or ultra-high vacuum.

According to a further aspect of the invention there is provided a device manufacturing method including providing a substrate that is at least partially covered by a layer of radiation-sensitive material; providing a projection beam of radiation using a radiation system; providing a vacuum beam path for the projection beam within a vacuum chamber; using a patterning device to endow the projection beam with a pattern in its cross-section; projecting the patterned beam of radiation onto a target portion of the layer of radiation-sensitive material; providing a movable member supported by a gas-bearing, the member having opposed first and second sides, the second side being exposed to the interior of the vacuum chamber; providing a pressure compensation vessel on the first side of the movable member; and substantially equalizing the gas pressure in the pressure compensation vessel on the first side of the movable member and over at least a portion of the second side of the movable member.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2(*b*) schematically depicts forces on the slider of FIG. 2(*a*);

FIG. 3(*b*) schematically depicts forces on the slider of FIG. 3(*a*); and

In the Figures, corresponding reference symbols indicate corresponding parts.

DETAILED DESCRIPTION

Figure 1:
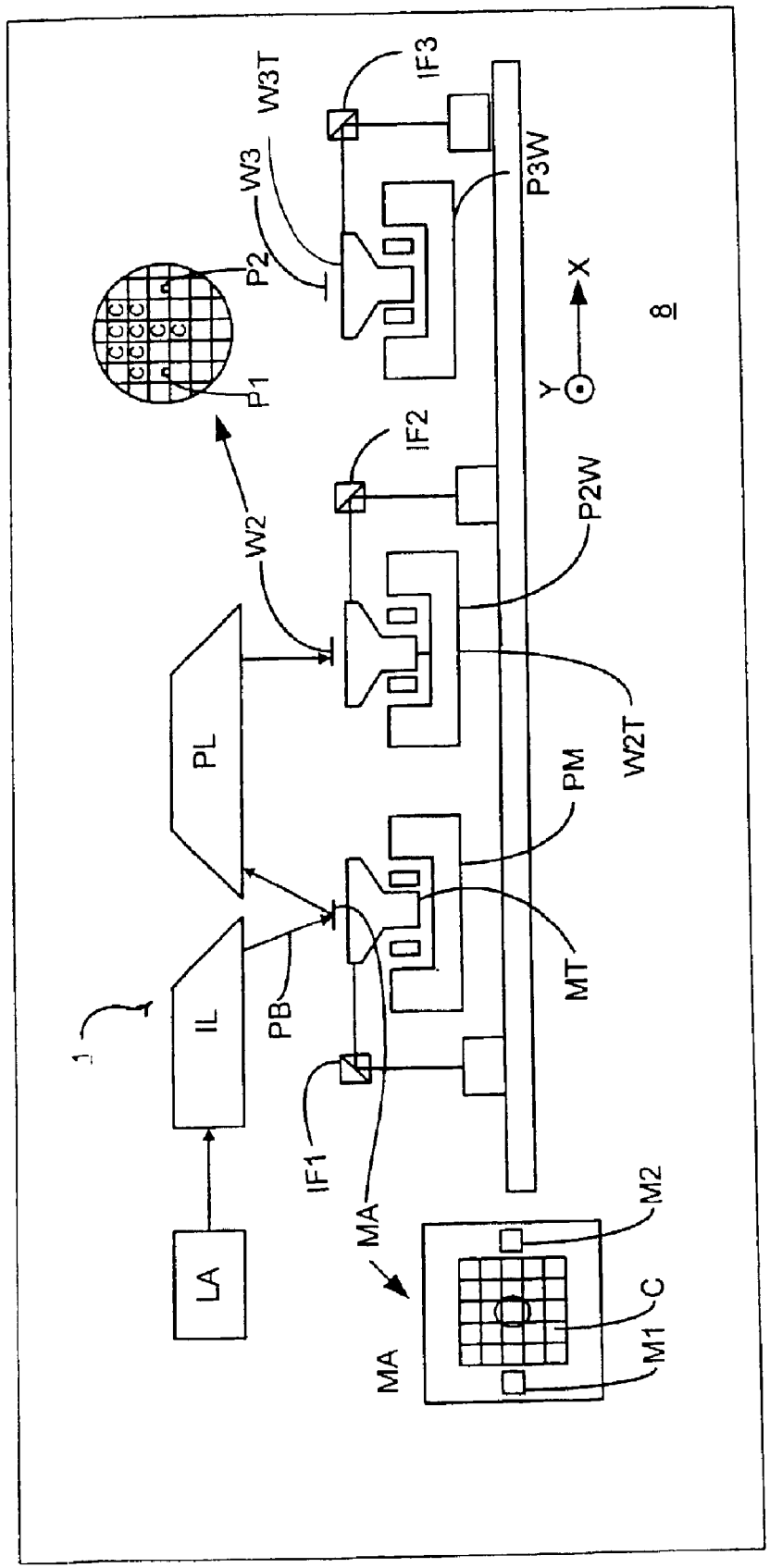
FIG. 1 depicts a lithographic projection apparatus according to an embodiment of the invention.

FIG. 1 schematically depicts a lithographic projection apparatus 1 according to the invention including a radiation system LA, IL constructed and arranged to supply a projection beam PB of radiation (e.g. UV or EUV radiation, electrons or ions); a first object table (mask table) MT provided with a first object (mask) holder to hold a mask MA (e.g. a reticle), and connected to a first positioning device PM constructed and arranged to accurately positioning the mask with respect to a projections system, or lens, PL; a second object table (substrate table) W2T provided with a second object (substrate) holder to hold a substrate W2 (e.g. a resist-coated silicon wafer), and connected to a second positioning device P2W constructed and arranged to accurately position the substrate with respect to the lens PL; a third object table (substrate table) W3T provided with a third object (substrate) holder to hold a substrate W3 (e.g. a resist-coated silicon wafer), and connected to a third positioning device P3W constructed and arranged to accurately position the substrate with respect to the lens PL; and the lens PL (e.g. a refractive or catadioptric system, a mirror group or an array of field deflectors) constructed and arranged to image an irradiated portion of the mask MA onto a target portion C of the substrate W.

The radiation system comprises a source LA which produces a beam of radiation (e.g. an undulator or wiggler provided around the path of an electron beam in a storage ring or synchrotron, a plasma source, an electron or ion beam source, a mercury lamp or a laser). This beam is caused to traverse various optical components included in illumination system IL so that the resultant beam PB has a desired shape and intensity distribution in its cross-section.

The beam PB subsequently impinges upon the mask MA which is held in a mask holder on the mask table MT. Having been selectively reflected (or transmitted) by the mask MA, the beam PB passes through the lens PL, which focuses the beam PB onto a target portion C of the substrate W2, W3. With the aid of the positioning devices P2W, P3W and interferometers IF2, IF3, the substrate table W2T, W3T can be moved accurately, e.g. so as to position different target portions C in the path of the beam PB. Similarly, the first positioning device PM and interferometer IF1 can be used to accurately position the mask MA with respect to the path of the beam PB, e.g. after mechanical retrieval of the mask MA from a mask library or during a scanning motion.

In the prior art, movement of the object tables MT and W2T is generally realized with the aid of a long-stroke module (coarse positioning) and a short-stroke module (fine positioning), which are not explicitly depicted in FIG. 1.

The depicted apparatus can be used in two different modes:

1. In step mode, the mask table MT is kept essentially stationary, and an entire mask image is projected in one go (i.e. a single "flash") onto a target portion C. The substrate table W2T, is then shifted in the X and/or Y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table W2T, is simultaneously moved in the same or opposite direction at a speed V=Mv, in which M is the magnification of the lens PL (e.g., M=¼ or ⅕). In this manner, a relatively large target portion C can be exposed, without having to compromise on resolution.

In a lithographic projection apparatus according to the present invention, at least one of first and second object tables MT, W2T, W3T are provided in a vacuum chamber 8, illustrated schematically in FIG. 1.

Figure 2A:
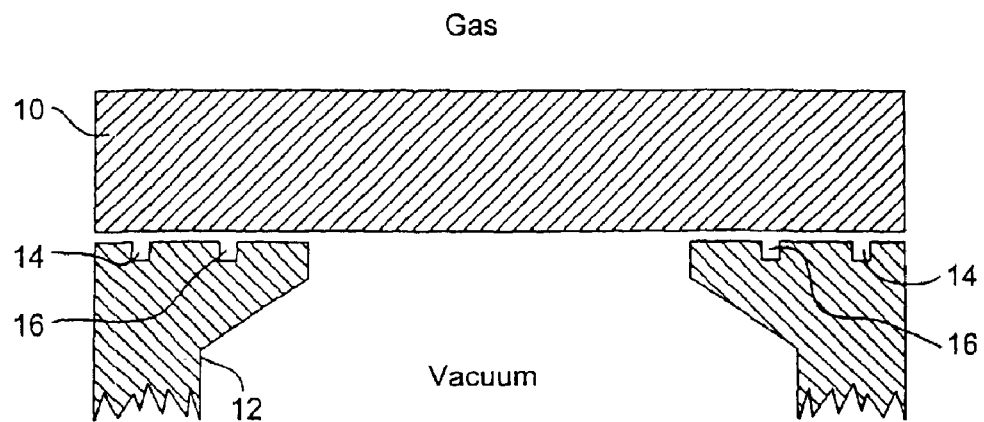
FIG. 2(*a*) depicts a schematic cross-section of a slider and its support arrangement.
Figure 2B:
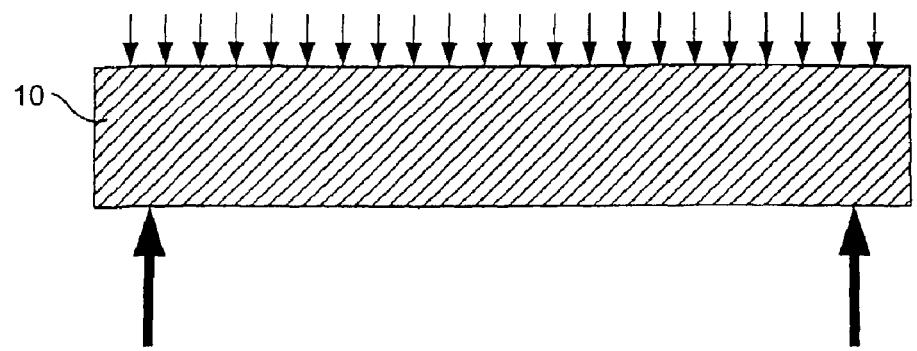
Figure 3A:
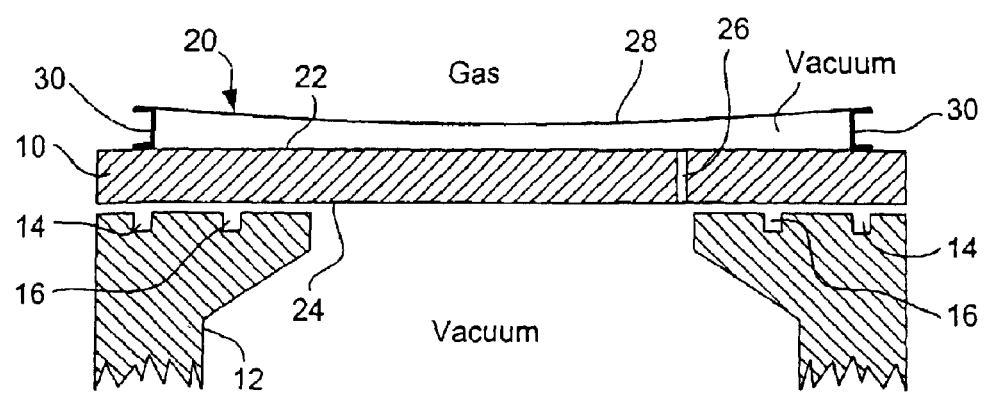
FIG. 3(*a*) depicts schematically in cross-section a slider apparatus embodying the invention.
Figure 3B:
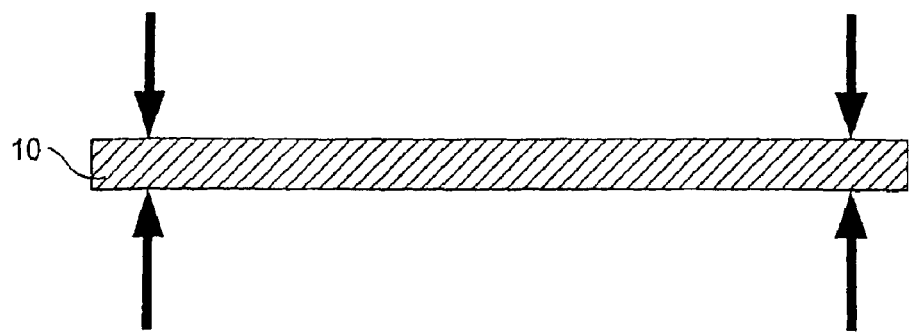

Referring to FIG. 3($a$), a slider arrangement for use in moving the mask table MT or substrate table W2T, W3T of the above embodiment of the invention is illustrated schematically in cross-section. Parts corresponding to those in FIG. 2($a$) are indicated by corresponding reference symbols and description thereof will not be repeated. The apparatus comprises a movable member, in this case a slider 10. On the first side 22 of the slider 10 is a pressure compensation vessel 20 and outside that is gas, such as air or purge gas, which may be at substantially atmospheric pressure. Below the slider 10 on its second side 24 is a vacuum space containing gas at reduced pressure. The slider 10 is supported on an air bearing 14 and the pressure difference between the vacuum space and the external gas is maintained by a differential pressure seal 16, both as described previously with reference FIG. 2($a$).

A passageway 26 is provided through the slider 10 so that the interior of the pressure compensation vessel 20 is in communication with the vacuum space in the region on the second side 24 of the slider 10. When equilibrium is reached, the pressure in the interior of the pressure compensation vessel 20 will be the same as that in the vacuum space and will therefore also be a vacuum. The interior of the pressure compensation vessel 20 may alternatively be evacuated by an independent gas evacuation means, without necessarily having the passageway 26. This is advantageous because in that case any contamination present in the pressure compensation vessel 20 due to out-gassing will not reach the very contaminant-sensitive vacuum space on the second side 24 of the slider 10. According to either scheme above, the gas pressure over the major portion of the first side 22 and the second side 24 of the slider 10 is the same and therefore there is no large bending moment on the slider 10, so it does not require such high rigidity and can be made more lightweight. Of course the external gas pressure is still present on the upper part of the apparatus, however, the upper wall 28 of the pressure compensation vessel transmits the resulting force to the sidewalls 30 of the pressure compensation vessel 20. Therefore instead of the pressure being distributed over the whole of the first side 22 of the slider 10, it is concentrated on the slider 10 where it is in contact with the sidewalls 30. The sidewalls 30 are positioned such that they correspond to the positions of the gas-bearing 14. The result of this is that, as shown in FIG. 3($b$), the force exerted on the slider 10 by the sidewalls 30, shown by the large downward arrows in FIG. 3($b$) is in line with the force on the slider 10 from the gas-bearing 14, shown by the upward arrows in FIG. 3($b$).

In use, the upward force of the air bearing 14 must counteract not only the atmospheric pressure on the upper part of the apparatus, but also the weight of the slider 10 and associated components. The weight of the slider 10, resulting from the action of the force of gravity is, of course, distributed throughout the slider 10, so there is still some bending moment acting on the slider 10, but this is intrinsic to the device so cannot be eliminated, but is reduced by the fact that the slider 10 can be made more lightweight because it is not being deformed by the gas pressure of $10^5$ Pa acting on its upper surface.

As illustrated in FIG. 3($a$), the upper wall 28 of the pressure compensation vessel 20 is shown as being deformable by the fact that it is bowed inwards due to the exterior gas pressure acting on the upper wall 28 that is not compensated because of the vacuum in the interior of the pressure compensation vessel 20. It is, of course, not essential to the invention that the pressure compensation vessel 20 is partially deformable, but this can be advantageous in enabling the pressure compensation vessel 20 to be made less rigid and more lightweight. One function of the pressure compensation vessel 20 is to change the distribution of the gas pressure forces over the slider 10 such that they are transmitted through the sidewalls 30 of the pressure compensation vessel 20 rather than being spread over the whole of the slider's first side 22.

Figure 4:
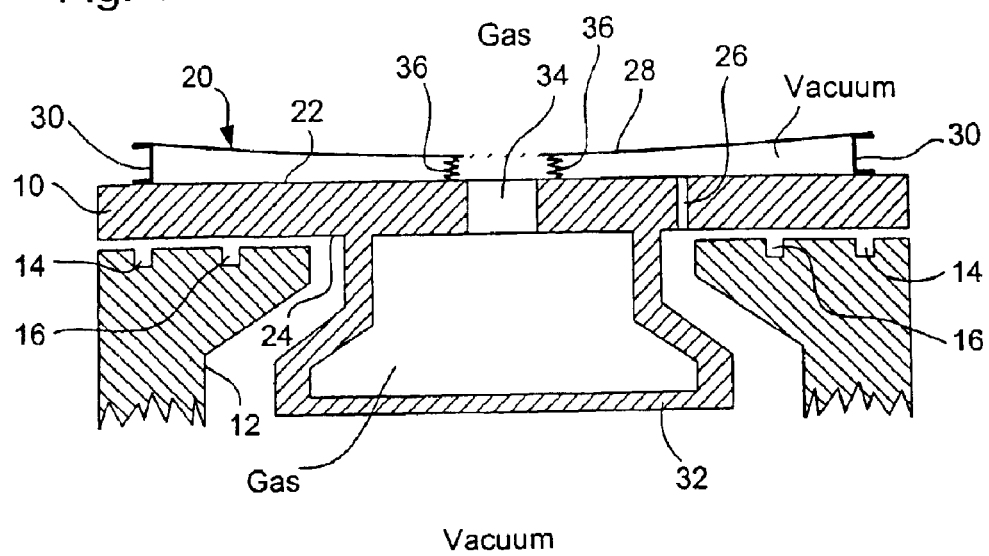
FIG. 4 shows schematically, in cross-section, a further embodiment of the slider apparatus according to the present invention.

Another embodiment of the invention is illustrated in FIG. 4. Only the features differing from FIG. 3($a$) will be described. In the previous figures, the slider 10 has been illustrated schematically as a simple beam, but in practice a more desirable shape is as shown in FIG. 4 in which there is a hollow member 32 provided on the underside of the slider 10 to enable air or other gas to be obtained inside the slider. To conduct cables and the like out of the interior of the hollow member 32, an aperture 34 is provided through the slider 10 and through the upper wall 28 of the pressure compensation vessel 20. Gas-tight bellows 36 are provided around the aperture 34 to seal the vacuum in the interior of the pressure compensation vessel 20 from the exterior atmosphere which can pass through the aperture 34 into the interior of the hollow member 32 along with any desired cables (not shown). The bellows 36 are made of metal or other suitable material and are in the form of a concertina. The bellows 36 are compliant so that the upper wall 28 of the pressure compensation vessel can deform, however the bellows 36 have zero or very small resilience so that when compressed vertically practically no force is transmitted to the first side 22 of the slider 10. In this way, the upper wall 28 of the pressure compensation vessel 20 can be made deformable and lightweight, but without transmitting force to the slider 10 at a point a long way distant from the support points provided by the gas-bearings 14. The majority of the force resulting from the atmospheric pressure on the upper wall 28 of the pressure compensation vessel 20 is still transmitted through the sidewalls 30 which lie in line with the air bearings 14. There is, of course, a minor additional force on the slider 10 equal to the area of the aperture 34 multiplied by the atmospheric pressure, but this force acts on the slider 10 where the walls of the hollow member 32 join the slider, and is still much smaller than the total force of the gas pressure on the upper wall 28 of the pressure compensation vessel 20.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a projection beam of radiation;
   a support structure constructed and arranged to supporting a patterning device, the patterning device constructed and arranged to pattern the projection beam according to a desired pattern;
   a vacuum chamber constructed and arranged to provide a vacuum beam path for the projection beam;
   a substrate table to hold a substrate;
   a projection system constructed and arranged to project the patterned beam onto a target portion of the substrate;
   a movable member supported in use by a gas-bearing, the movable member having opposed first and second sides, the second side being exposed to the interior of the vacuum chamber; and
   a pressure compensation vessel provided on the first side of the movable member for providing substantially equal gas pressure over at least a portion of the first and second sides of the movable member.

2. An apparatus according to claim 1, further comprising two regions at different gas pressures separated by the movable member and pressure compensation vessel, one of the regions comprising the interior of the vacuum chamber.

3. An apparatus according to claim 2, further comprising a differential pressure seal for maintaining the different gas pressures in the two regions while enabling the movable member to be supported movably by the gas-bearing.

4. An apparatus according to claim 2, wherein the interior of the pressure compensation vessel is in communication with the region on the second side of the movable member via a passageway.

5. An apparatus according to claim 1, wherein the pressure compensation vessel is at least partially deformable.

6. An apparatus according to claim 1, wherein at least one wall of the pressure compensation vessel contacts the movable member in the vicinity of the area at which the movable member is supported, in use, by the gas-bearing.

7. An apparatus according to claim 1, wherein a hollow member is provided on the second side of the movable member, and an aperture is provided from the interior of the hollow member through the movable member and through the pressure compensation vessel.

8. An apparatus according to claim 7, wherein bellows are provided around the aperture to isolate the interior of the pressure compensation vessel from the interior of the hollow member.

9. An apparatus according to claim 1, wherein the gas pressure within the pressure compensation vessel and on the second side of the movable member is less than atmospheric pressure.

10. A device manufacturing method, comprising:
    providing a substrate that is at least partially covered by a layer of radiation-sensitive material;
    providing a projection beam of radiation using a radiation system;
    providing a vacuum beam path for the projection beam within a vacuum chamber;
    using a patterning device to endow the projection beam with a pattern in its cross-section;
    projecting the patterned beam of radiation onto a target portion of the layer of radiation-sensitive material;
    providing a movable member supported by a gas-bearing, the member having opposed first and second sides, the second side being exposed to the interior of the vacuum chamber;
    providing a pressure compensation vessel on the first side of the movable member; and
    substantially equalizing the gas pressure in the pressure compensation vessel on the first side of the movable member and over at least a portion of the second side of the movable member.

11. A method according to claim 10, wherein two regions at different gas pressures are separated by the movable member and pressure compensation vessel, one of the regions comprising the interior of the vacuum chamber.

12. A method according to claim 11, further comprising providing a differential pressure seal for maintaining the different gas pressures in the two regions while enabling the movable member to be supported movably by the gas-bearing.

13. A method according to claim 11, wherein the interior of the pressure compensation vessel is in communication with the region on the second side of the movable member via a passageway.

14. A method according to claim 10, wherein the pressure compensation vessel is at least partially deformable.

15. A method according to claim 10, wherein at least one wall of the pressure compensation vessel contacts the movable member in the vicinity of the area at which the movable member is supported, in use, by the gas-bearing.

16. A method according to claim 10, further comprising providing a hollow member on the second side of the movable member, and providing an aperture from the interior of the hollow member through the movable member and through the pressure compensation vessel.

17. A method according to claim 16, wherein bellows are provided around the aperture to isolate the interior of the pressure compensation vessel from the interior of the hollow member.

18. A method according to claim 10, wherein the gas pressure within the pressure compensation vessel and on the second side of the movable member is less than atmospheric pressure.

19. A device made by thee method of claim 10.

* * * * *